United States Patent
Chigira

(10) Patent No.: US 11,631,540 B2
(45) Date of Patent: *Apr. 18, 2023

(54) MULTILAYER CERAMIC CAPACITOR OF BARIUM TITANATE CERAMIC DOPED WITH MOLYBDENUM AND MANUFACTURING METHOD THEREOF

(71) Applicant: TAIYO YUDEN CO., LTD., Tokyo (JP)

(72) Inventor: Noriyuki Chigira, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/179,154

(22) Filed: Feb. 18, 2021

(65) Prior Publication Data

US 2021/0183582 A1   Jun. 17, 2021

Related U.S. Application Data

(63) Continuation of application No. 16/039,171, filed on Jul. 18, 2018, now Pat. No. 10,964,481.

(30) Foreign Application Priority Data

Jul. 19, 2017   (JP) .............................. JP2017-140309
Jul. 19, 2017   (JP) .............................. JP2017-140310

(51) Int. Cl.
*H01G 4/30* (2006.01)
*H01G 4/12* (2006.01)
*H01L 49/02* (2006.01)

(52) U.S. Cl.
CPC ............. *H01G 4/30* (2013.01); *H01G 4/1227* (2013.01); *H01L 28/55* (2013.01)

(58) Field of Classification Search
CPC ........ H01G 4/30; H01G 4/1227; H01G 4/012; H01L 28/55
See application file for complete search history.

(56) References Cited

U.S. PATENT DOCUMENTS 4,054,531 A   10/1977 Takahashi et al.
4,467,396 A    8/1984 Leupold et al.
(Continued)

FOREIGN PATENT DOCUMENTS

CN   1392570 A    1/2003
CN   1870190 A   11/2006
(Continued)

OTHER PUBLICATIONS

A First Office Action issued by the State Intellectual Property Office of China dated Apr. 1, 2021, for Chinese counterpart application No. 201810782204.3 (7 pages).

(Continued)

*Primary Examiner* — David M Sinclair
(74) *Attorney, Agent, or Firm* — Law Office of Katsuhiro Arai

(57) ABSTRACT

A multilayer ceramic capacitor includes: a multilayer structure in which each of a plurality of dielectric layers and each of a plurality of internal electrode layers are alternately stacked, the plurality of internal electrode layers being alternately exposed to a first edge face and a second edge face of the multilayer structure, wherein: a concentration of Mo with respect to a main component ceramic of an end margin region and a side margin region is lower than a concentration of Mo with respect to a main component ceramic of the dielectric layers in the multilayer structure.

2 Claims, 5 Drawing Sheets

(56) References Cited

U.S. PATENT DOCUMENTS

| | | | |
|---|---|---|---|
| 9,460,857 | B2 | 10/2016 | Oguni |
| 10,964,481 | B2* | 3/2021 | Chigira .................. H01G 4/30 |
| 11,017,947 | B2* | 5/2021 | Chigira .................. H01G 4/30 |
| 2002/0036882 | A1 | 3/2002 | Kishi et al. |
| 2003/0016484 | A1* | 1/2003 | Iwaida .................. C04B 35/468 |
| | | | 29/25.42 |
| 2006/0256504 | A1 | 11/2006 | Kojima |
| 2008/0304204 | A1 | 12/2008 | Suzuki |
| 2010/0008019 | A1 | 1/2010 | Burn |
| 2013/0100578 | A1* | 4/2013 | Suh .......................... H01G 4/30 |
| | | | 361/321.2 |
| 2013/0114182 | A1* | 5/2013 | Suh ........................ H01G 4/018 |
| | | | 361/321.2 |
| 2013/0163144 | A1 | 6/2013 | Shimada et al. |
| 2013/0250482 | A1 | 9/2013 | Wang et al. |
| 2013/0314841 | A1 | 11/2013 | Oguni |
| 2014/0022692 | A1 | 1/2014 | Yoon et al. |
| 2014/0301013 | A1 | 10/2014 | Kim |
| 2016/0189865 | A1 | 6/2016 | Kawamura et al. |
| 2016/0217924 | A1 | 7/2016 | Morita et al. |
| 2016/0284473 | A1 | 9/2016 | Murosawa et al. |
| 2017/0032894 | A1 | 2/2017 | Kawamura et al. |
| 2017/0032895 | A1 | 2/2017 | Ogata et al. |

FOREIGN PATENT DOCUMENTS

| | | |
|---|---|---|
| CN | 103125006 A | 5/2013 |
| CN | 104103424 A | 10/2014 |
| CN | 105742057 A | 7/2016 |
| JP | H10172858 A | 6/1998 |
| JP | 2002043162 A | 2/2002 |
| JP | 2005039068 A | 2/2005 |
| JP | 2005089294 A * | 4/2005 |
| JP | 2007173714 A | 7/2007 |
| JP | 2009016796 A | 1/2009 |
| JP | 2016127120 A | 7/2016 |
| JP | 2016139720 A | 8/2016 |
| JP | 2017028224 A | 2/2017 |
| JP | 2017028225 A | 2/2017 |
| KR | 1020130081284 A | 7/2013 |
| TW | 201340146 A | 10/2013 |
| WO | 2012114877 A1 | 8/2012 |
| WO | 2012117945 A1 | 9/2012 |

OTHER PUBLICATIONS

Kan, Preparation and characterization of SrTiO_3-based powders, CMFD, Engineering Science & Technology, Apr. 15, 2010, B020-104, vol. 1, Issue 4.

Zhang et al., One-time Sintering Technology of the Grain Boundary Layer Semiconductor Ceramic Capacitors, Electronic Components & Materials, May 31, 2005, pp. 43-48, vol. 24, No. 5.

A Notice of Reasons for Refusal issued by the Japanese Patent Office, dated May 25, 2021, for Japanese counterpart application No. 2017-140309. (4 pages).

A Notice of Reasons for Refusal issued by the Japanese Patent Office, dated May 25, 2021, for Japanese counterpart application No. 2017-140310. (2 pages).

Final Office Action issued by U.S. Patent and Trademark Office, dated Jul. 21, 2020, for related U.S. Appl. No. 16/039,171 (20 pages).

Non-Final Office Action issued by U.S. Patent and Trademark Office, dated Jan. 27, 2020, for related U.S. Appl. No. 16/039,171 (18 pages).

Notice of Allowance issued by U.S. Patent and Trademark Office, dated Nov. 23, 2020, for related U.S. Appl. No. 16/039,171 (8 pages).

A Notification of Opinion after Examination issued by Taiwan Intellectual Property Office, dated Jul. 9, 2021, for Taiwan counterpart application No. 107123839. (7 pages).

A Decision of Dismissal of Amendment issued by the Japanese Patent Office, dated Jul. 19, 2022, for Japanese counterpart application No. 2017-140309. (2 pages).

A Decision of Refusal issued by the Japanese Patent Office, dated Jul. 19, 2022, for Japanese counterpart application No. 2017-140309. (1 page).

A Notification of Reason for Refusal issued by Korean Intellectual Property Office dated Apr. 18, 2022, for Korean counterpart application No. 10-2018-0081417 (6 pages).

A Notice of Reasons for Refusal issued by the Japanese Patent Office, dated Jan. 5, 2022, for Japanese counterpart application No. 2017-140309. (3 pages).

* cited by examiner

MULTILAYER CERAMIC CAPACITOR OF BARIUM TITANATE CERAMIC DOPED WITH MOLYBDENUM AND MANUFACTURING METHOD THEREOF

CROSS-REFERENCE TO RELATED APPLICATION

This application is a continuation of U.S. patent application Ser. No. 16/039,171, filed Jul. 18, 2018, which is based upon and claims the benefit of priority of Japanese Patent Applications No. 2017-140309, filed on Jul. 19, 2017, and No. 2017-140310, filed on Jul. 19, 2017, each disclosure of which is herein incorporated herein by reference in its entirety. The applicant herein explicitly rescinds and retracts any prior disclaimers or disavowals or any amendment/statement otherwise limiting claim scope made in any parent, child or related prosecution history with regard to any subject matter supported by the present application.

FIELD

A certain aspect of the present invention relates to a multilayer ceramic capacitor and a manufacturing method thereof.

BACKGROUND

Recently, electronic devices such as smart phones or mobile phones are being downsized. Thereby, electronic components mounted on the electronic devices are rapidly being downsized. For example, in a field of multilayer ceramic electronic components of chip type represented by a multilayer ceramic capacitor, thicknesses of dielectric layers and internal electrode layers are reduced in order to reduce a chip size while ensuring their properties.

When the thickness of the dielectric layer is reduced, a voltage applied to each dielectric layer increases. In this case, a lifetime of the dielectric layer may be shortened. And, reliability of the multilayer ceramic capacitor may be degraded. And so, there are disclosed technologies in which a donor element such as Mo (molybdenum), Nb (niobium), Ta (tantalum) or W (tungsten) is added to the dielectric layer (for example, see Japanese Patent Application Publications No. 2016-127120, No. 2016-139720, No. 2017-028224 and No. 2017-028225).

SUMMARY OF THE INVENTION

However, when a concentration of the donor element is high in at least one of an end margin region, a side margin region and a cover layer, a structural defect may occur because of delay of sintering or abnormal grain growth at a chip surface. Therefore, the reliability of the multilayer ceramic capacitor may be degraded.

The present invention has a purpose of providing a multilayer ceramic capacitor and a manufacturing method of the multilayer ceramic capacitor that are capable of improving reliability.

According to an aspect of the present invention, there is provided a multilayer ceramic capacitor including: a multilayer structure in which each of a plurality of dielectric layers and each of a plurality of internal electrode layers are alternately stacked, a main component of the dielectric layers being ceramic, the multilayer structure having a rectangular parallelepiped shape, the plurality of internal electrode layers being alternately exposed to a first edge face and a second edge face of the multilayer structure, the first edge face facing with the second edge face; and a cover layer that is provided at least on an upper face and a lower face of the multilayer structure in a stacking direction of the multilayer structure, a main component of the cover layer being a same as that of the dielectric layers, wherein: a concentration of a donor element with respect to a main component ceramic of at least one of the cover layer, an end margin region and a side margin region is lower than a concentration of the donor element with respect to a main component ceramic of the dielectric layers in the multilayer structure; the end margin region is a region in which internal electrode layers coupled to the first edge face of the multilayer structure face with each other without sandwiching internal electrode layers coupled to the second edge face of the multilayer structure and another region in which internal electrode layers coupled to the second edge face of the multilayer structure face with each other without sandwiching internal electrode layers coupled to the first edge face of the multilayer structure; and the side margin region covers edge portions to which the plurality of internal electrode layers extend toward two side faces other than the first edge face and the second edge face.

According to another aspect of the present invention, there is provided a manufacturing method of a multilayer ceramic capacitor including: providing a first pattern of metal conductive pastes, on a green sheet including main component ceramic particles; providing a second pattern including main component ceramic particles, on a region of the green sheet around the metal conductive pastes; and baking a ceramic multilayer structure in which a plurality of stack units obtained by repeating of the providing of the first pattern and the providing of the second pattern so that each position of the first pattern is alternately shifted, wherein a concentration of a donor element with respect to a main component ceramic of the second pattern is lower than a concentration of the donor element with respect to a main component ceramic of the green sheet.

According to another aspect of the present invention, there is provided a manufacturing method of a multilayer ceramic capacitor including: providing a first pattern of metal conductive pastes, on a green sheet including main component ceramic particles; stacking a plurality of stack units obtained by repeating of the providing of the first pattern so that each position of the first pattern is alternately shifted; providing a cover sheet including main component ceramic particles, on at least one of an upper face or a lower face of a ceramic multilayer in a stacking direction, the ceramic multilayer structure being obtained by the stacking, wherein a concentration of a donor element with respect to a main component ceramic of the cover sheet is lower than a concentration of the donor element with respect to a main component ceramic of the green sheet.

DETAILED DESCRIPTION

A description will be given of an embodiment with reference to the accompanying drawings.

Figure 1:
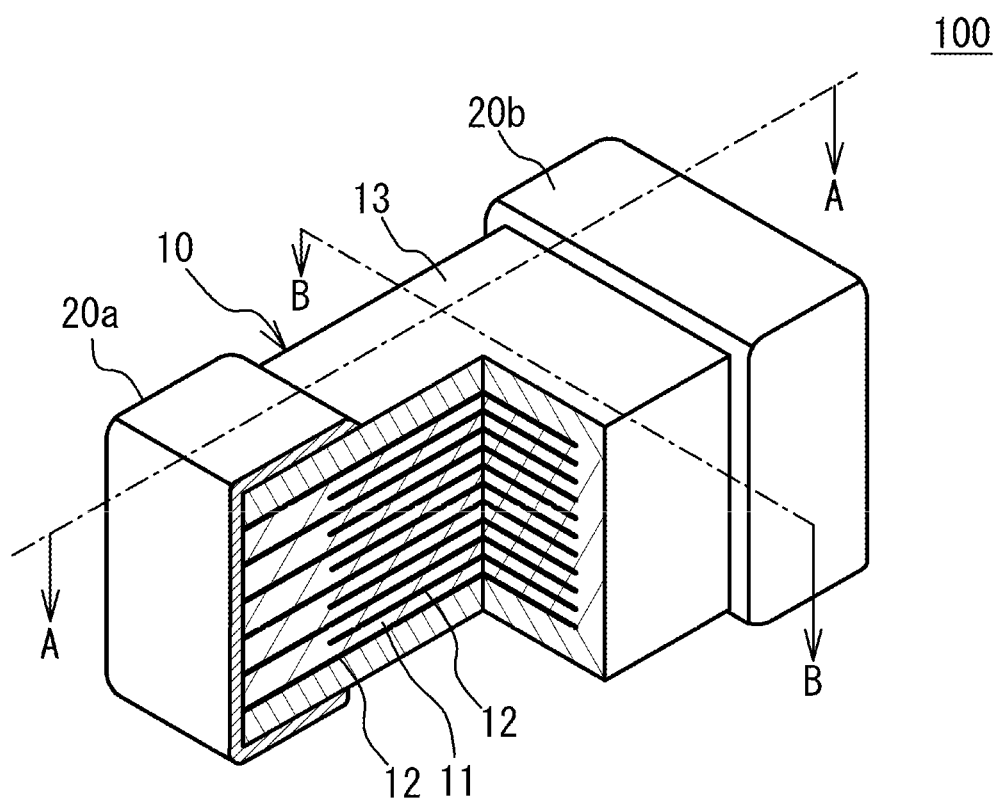
FIG. 1 illustrates a partial perspective view of a multilayer ceramic capacitor.
Figure 2:
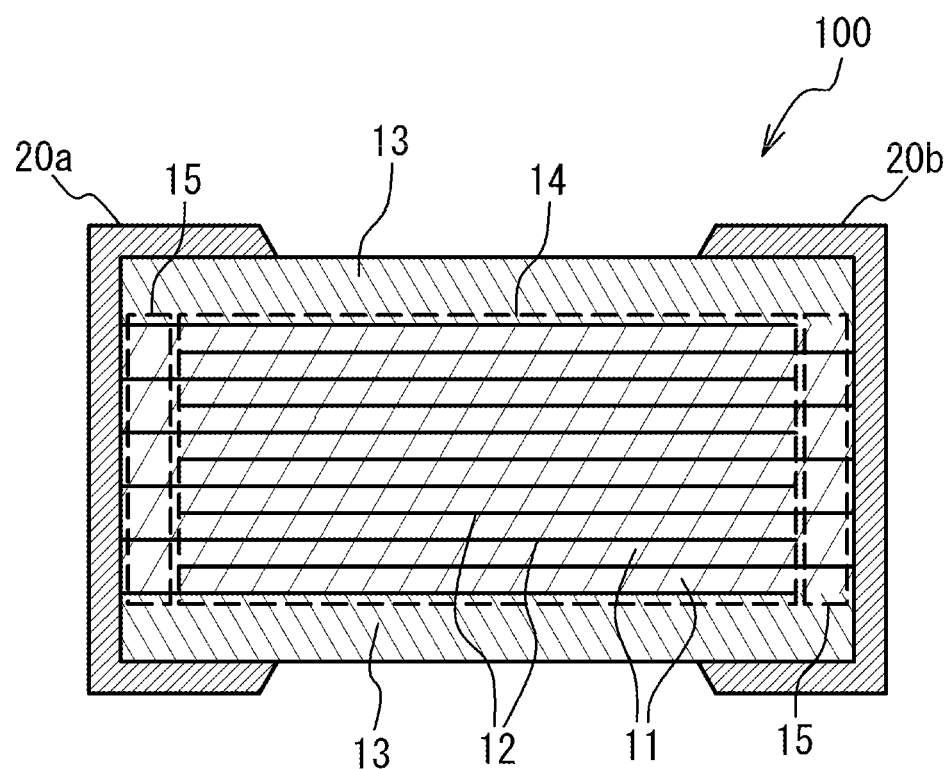
FIG. 2 illustrates a cross sectional view taken along a line A-A of FIG. 1.
Figure 3:
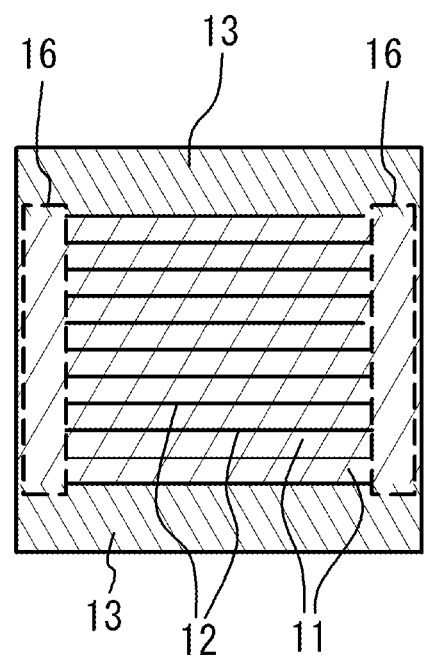
FIG. 3 illustrates a cross sectional view taken along a line B-B of FIG. 1.

(Embodiment) FIG. 1 illustrates a partial perspective view of a multilayer ceramic capacitor 100 in accordance with an embodiment. FIG. 2 illustrates a cross sectional view taken along a line A-A of FIG. 1. FIG. 3 illustrates a cross sectional view taken along a line B-B of FIG. 1. As illustrated in FIG. 1 to FIG. 3, the multilayer ceramic capacitor 100 includes a multilayer chip 10 having a rectangular parallelepiped shape, and a pair of external electrodes 20a and 20b that are respectively provided at two edge faces of the multilayer chip 10 facing each other. In four faces other than the two edge faces of the multilayer chip 10, two faces other than an upper face and a lower face of the multilayer chip 10 in a stacking direction are referred to as side faces. The external electrodes 20a and 20b extend to the upper face, the lower face and the two side faces of the multilayer chip 10. However, the external electrodes 20a and 20b are spaced from each other.

The multilayer chip 10 has a structure designed to have dielectric layers 11 and internal electrode layers 12 alternately stacked. The dielectric layer 11 includes ceramic material acting as a dielectric material. The internal electrode layers 12 include a base metal material. End edges of the internal electrode layers 12 are alternately exposed to a first edge face of the multilayer chip 10 and a second edge face of the multilayer chip 10 that is different from the first edge face. In the embodiment, the first face faces with the second face. The external electrode 20a is provided on the first edge face. The external electrode 20b is provided on the second edge face. Thus, the internal electrode layers 12 are alternately conducted to the external electrode 20a and the external electrode 20b. Thus, the multilayer ceramic capacitor 100 has a structure in which a plurality of dielectric layers 11 are stacked and each two of the dielectric layers 11 sandwich the internal electrode layer 12. In the multilayer chip 10, the internal electrode layer 12 is positioned at an outermost layer. The upper face and the lower face of the multilayer chip 10 that are the internal electrode layers 12 are covered by cover layers 13. A main component of the cover layer 13 is a ceramic material. For example, a main component of the cover layer 13 is the same as that of the dielectric layer 11.

For example, the multilayer ceramic capacitor 100 may have a length of 0.2 mm, a width of 0.125 mm and a height of 0.125 mm. The multilayer ceramic capacitor 100 may have a length of 0.4 mm, a width of 0.2 mm and a height of 0.2 mm. The multilayer ceramic capacitor 100 may have a length of 0.6 mm, a width of 0.3 mm and a height of 0.3 mm. The multilayer ceramic capacitor 100 may have a length of 1.0 mm, a width of 0.5 mm and a height of 0.5 mm. The multilayer ceramic capacitor 100 may have a length of 3.2 mm, a width of 1.6 mm and a height of 1.6 mm. The multilayer ceramic capacitor 100 may have a length of 4.5 mm, a width of 3.2 mm and a height of 2.5 mm. However, the size of the multilayer ceramic capacitor 100 is not limited.

A main component of the internal electrode layers 12 is a base metal such as nickel (Ni), copper (Cu), tin (Sn) or the like. The internal electrode layers 12 may be made of a noble metal such as platinum (Pt), palladium (Pd), silver (Ag), gold (Au) or alloy thereof. The dielectric layers 11 are mainly composed of a ceramic material that is expressed by a general formula $ABO_3$ and has a perovskite structure. The perovskite structure includes $ABO_3$-a having an off-stoichiometric composition. For example, the ceramic material is such as $BaTiO_3$ (barium titanate), $CaZrO_3$ (calcium zirconate), $CaTiO_3$ (calcium titanate), $SrTiO_3$ (strontium titanate), $Ba_{1-x-y}Ca_xSr_yTi_{1-z}Zr_zO_3$ ($0 \leq x \leq 1$, $0 \leq y \leq 1$, $0 \leq z \leq 1$) having a perovskite structure.

As illustrated in FIG. 2, a region, in which a set of the internal electrode layers 12 connected to the external electrode 20a face another set of the internal electrode layers 12 connected to the external electrode 20b, is a region generating electrical capacity in the multilayer ceramic capacitor 100. And so, the region is referred to as a capacity region 14. That is, the capacity region 14 is a region in which the internal electrode layers 12 next to each other are connected to different external electrodes face each other.

A region, in which the internal electrode layers 12 connected to the external electrode 20a face with each other without sandwiching the internal electrode layer 12 connected to the external electrode 20b, is referred to as an end margin region 15. A region, in which the internal electrode layers 12 connected to the external electrode 20b face with each other without sandwiching the internal electrode layer 12 connected to the external electrode 20a is another end margin region 15. That is, the end margin region 15 is a region in which a set of the internal electrode layers 12 connected to one external electrode face with each other without sandwiching the internal electrode layer 12 connected to the other external electrode. The end margin region 15 is a region that does not generate electrical capacity in the multilayer ceramic capacitor 100.

As illustrated in FIG. 3, a region of the multilayer chip 10 from the two sides thereof to the internal electrode layers 12 is referred to as a side margin region 16. That is, the side margin region 16 is a region covering edges of the stacked internal electrode layers 12 in the extension direction toward the two side faces. The side margin region 16 does not generate electrical capacity.

Figure 4A:
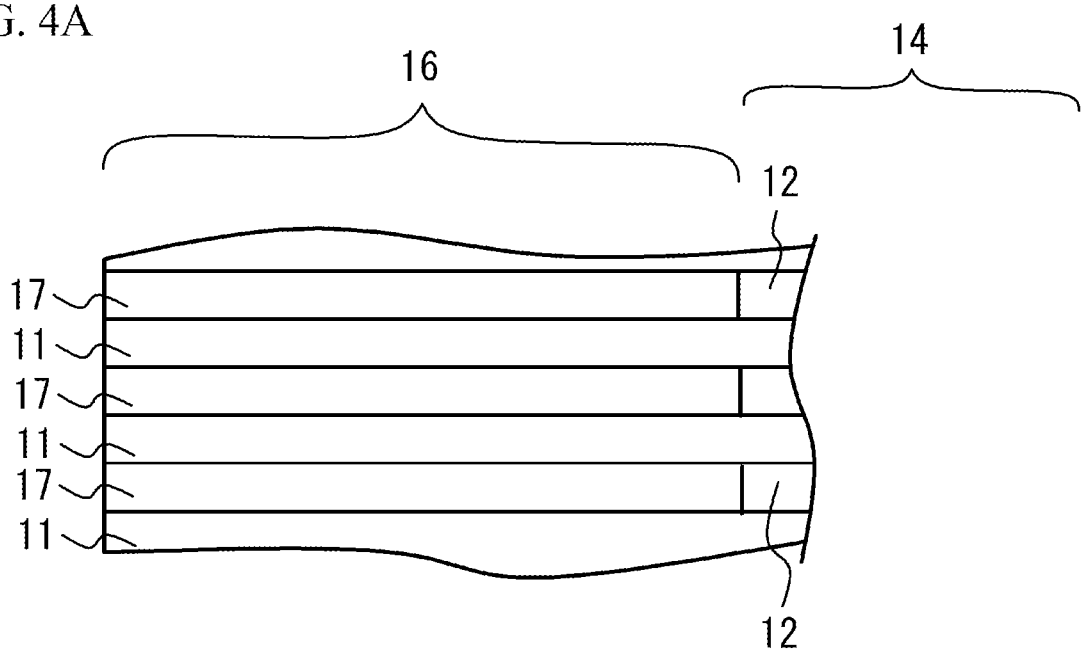
FIG. 4A illustrates an enlarged cross sectional view of a side margin region.

FIG. 4A illustrates an enlarged view of the cross section of the side margin region 16. The side margin region 16 has a structure in which the dielectric layer 11 and a reverse pattern layer 17 are alternately stacked in a stacking direction of the dielectric layer 11 and the internal electrode layer 12 in the capacity region 14. Each of the dielectric layers 11 of the capacity region 14 are continuously formed with each of the dielectric layers 11 of the side margin region 16. With the structure, a level difference between the capacity region 14 and the side margin region 16 is suppressed.

Figure 4B:
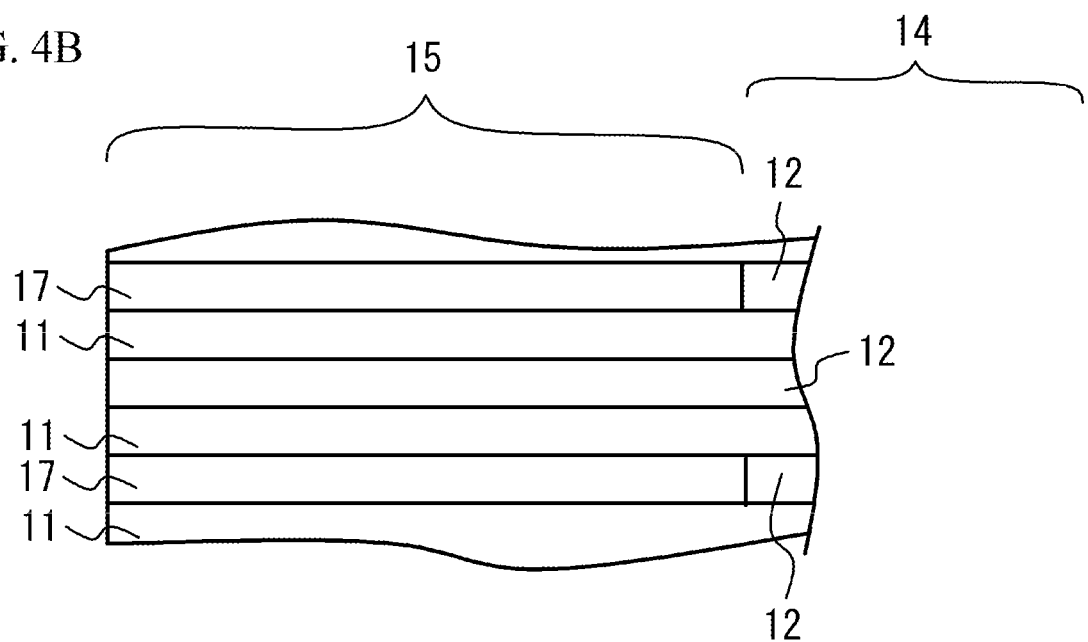
FIG. 4B illustrates an enlarged cross sectional view of an end margin region.

FIG. 4B illustrates an enlarged view of the cross section of the end margin region 15. Compared to the side margin region 16, in the end margin region 15, every other layer, the internal electrode layers 12 extends to the edge face of the end margin region 15. The reverse pattern layer 17 is not provided in a layer where the internal electrode layer 12 extends to the edge face of the end margin region 15. Each of the dielectric layers 11 of the capacity region 14 is continuously formed with each of the dielectric layers 11 of the end margin region 15. With the structure, a level difference between the capacity region 14 and the end margin region 15 is suppressed.

The dielectric layer 11 and the cover layer 13 are formed by baking raw material powders of which a main component ceramic has a perovskite structure. The raw material powders are exposed to reductive atmosphere during the baking. Therefore, oxygen defect occurs in the main component ceramic. And so, it is thought that Mo, Nb, Ta, W or the like acting as a donor is added to the dielectric layer 11 in order to displace the B site of the perovskite structure expressed by $ABO_3$ with the donor element. When the donor element is added to the dielectric layer 11, formation of the oxygen defect of the main component ceramic may be suppressed. Therefore, the lifetime of the dielectric layer 11 is improved, the reliability is improved, a high dielectric constant is achieved, and preferable bias characteristic is achieved. However, when a large amount of the donor element is added to the reverse pattern layer 17, the structural defect caused by the delay of sintering may occur because of the abnormal grain growth at the surface of the multilayer chip 10 caused by the promotion of the grain growth of the main component ceramic or prevention of refinement caused by the abnormal grain growth. Alternatively, when a large amount of the donor element is added to the reverse pattern layer 17, the structural defect caused by spheroidizing of the internal electrode layer 12 near the reverse pattern layer 17 may occur because the grain growth of the reverse pattern layer 17 is promoted. Therefore, the reliability of the multilayer ceramic capacitor 100 may be degraded. For example, the humidity resistance is degraded because of the prevention of the refinement. Increasing of a short rate, reduction of the lifetime, reduction of BDV (Breakdown Voltage) or the like may occur because of the structural defect caused by the spheroidizing. When a large amount of the donor element is added to the cover layer 13, the structural defect caused by the delay of sintering may occur because of the abnormal grain growth at the surface of the cover layer 13 caused by the promotion of the grain growth of the main component ceramic or the prevention of refinement caused by the abnormal grain growth. Therefore, the reliability of the multilayer ceramic capacitor 100 may be degraded. For example, the humidity resistance may be degraded because of the prevention of refinement.

And so, in the embodiment, a concentration of the donor element with respect to the main component ceramic in at least one of the cover layer 13 and the reverse pattern layer 17 is lower than a concentration of Mo with respect to the main component ceramic in the dielectric layers 11. With the structure, the abnormal grain growth at the surface of the multilayer chip 10 or the delay of sintering is suppressed, and the structural defect is suppressed. Therefore, the reliability of the multilayer ceramic capacitor 100 is improved.

When the concentration of the donor element with respect to the main component ceramic in the reverse pattern layer 17 is lower than the concentration of Mo with respect to the main component ceramic in the dielectric layers 11, a concentration of the donor element with respect to the main component ceramic in the whole of the end margin region 15 and the side margin region 16 (hereinafter generically referred to as a margin region) is lower than a concentration of the donor element with respect to the main component ceramic in the dielectric layers 11 in the capacity region 14, because of diffusion of the donor element during the baking.

When the amount of the donor element in the reverse pattern layer 17 is excessively large, it may not necessarily possible to sufficiently suppress the abnormal grain growth at the surface of the multilayer chip 10 and the delay of sintering. And so, it is preferable that the concentration of the donor element in the reverse pattern layer 17 has an upper limit. In the embodiment, when Mo is used as the donor element as an example, it is preferable that the concentration of Mo with respect to the main component ceramic in the reverse pattern layer 17 is less than 0.2 atm %. In this case, it is more preferable that the concentration is 0.1 atm % or less. The concentration (atm %) is a concentration in a case where the B site of the main component ceramic having the perovskite structure expressed as a general formula $ABO_3$ is 100 atm %. In the following description, a concentration (atm %) has the same meaning.

In the embodiment, the concentration of the donor element with respect to the main component ceramic in the both of the end margin region 15 and the side margin region 16 is lower than the concentration of the donor element with respect to the main component ceramic in the dielectric layers 11 in the capacity region 14. However, the structure is not limited. For example, the concentration of the donor element in at least one of the margin regions is lower than the concentration of the donor element with respect to the main component ceramic in the dielectric layers 11 in the capacity region 14.

When the amount of the donor element in the cover layer 13 is excessively large, it may not necessarily possible to sufficiently suppress the abnormal grain growth at the surface of the cover layer 13 and the delay of sintering. And so, it is preferable that the concentration of the donor element in the cover layer 13 has an upper limit. In the embodiment, when Mo is used as the donor element as an example, it is preferable that the concentration of Mo with respect to the main component ceramic in the cover layer 13 is less than 0.2 atm %. In this case, it is more preferable that the concentration is 0.1 atm % or less.

In the embodiment, the concentration of the donor element with respect to the main component ceramic in the both of the cover layers 13 of the upper face and the lower face of the multilayer chip 10 is lower than the concentration of the donor element with respect to the main component ceramic in the dielectric layers 11. However, the structure is not limited. For example, the concentration of the donor element in at least one of the cover layers 13 is lower than the concentration of the donor element with respect to the main component ceramic in the dielectric layers 11.

When the concentration of the donor element has distribution in a plane direction of the dielectric layers 11, it is preferable that the concentration of the donor element with respect to the main component ceramic in the cover layer 13 is lower than the concentration of the donor element with respect to the main component ceramic in the dielectric layers 11 in the capacity region 14.

HALT characteristic of a multilayer ceramic capacitor using Mo as the donor element is better than any other multilayer ceramic capacitors using another element such as Nb, Ta, W or the like as the donor element.

Figure 5:
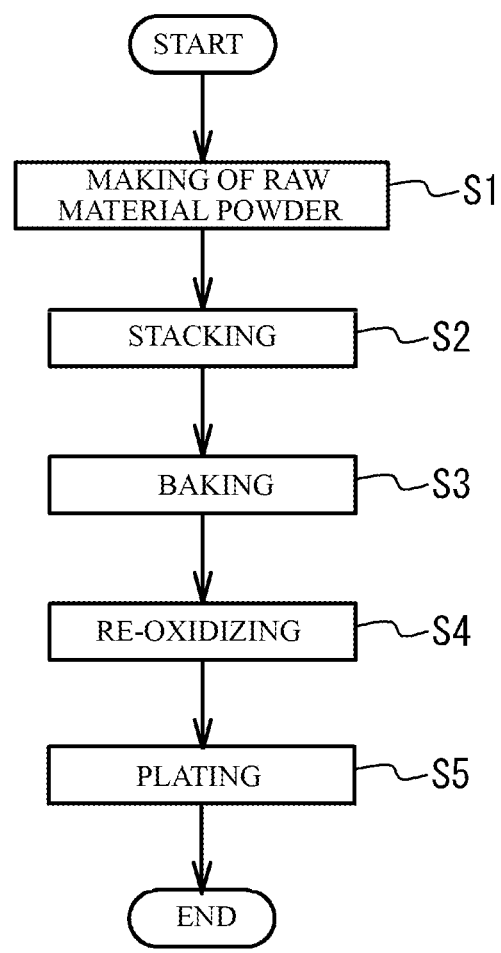
FIG. 5 illustrates a flow of a manufacturing method of a multilayer ceramic.

Next, a description will be given of a manufacturing method of the multilayer ceramic capacitor 100. FIG. 5 illustrates a manufacturing method of the multilayer ceramic capacitor 100.

(Making process of raw material powder) A dielectric material for forming the dielectric layer 11 is prepared. Generally, an A site element and a B site element are included in the dielectric layer 11 in a sintered phase of grains of $ABO_3$. For example, $BaTiO_3$ is tetragonal compound having a perovskite structure and has a high dielectric constant. Generally, $BaTiO_3$ is obtained by reacting a titanium material such as titanium dioxide with a barium material such as barium carbonate and synthesizing barium titanate. Various methods can be used as a synthesizing method of the ceramic structuring the dielectric layer 11. For example, a solid-phase method, a sol-gel method, a hydro-thermal method or the like can be used. The embodiment may use any of these methods.

An additive compound may be added to resulting ceramic powders, in accordance with purposes. The additive compound may be an oxide of Mo, Nb, Ta, W, Mn (manganese), V (vanadium), Cr (chromium) or a rare earth element (Y (yttrium), Sm (samarium), Eu (europium), Gd (gadolinium), Tb (terbium), Dy (dysprosium), Ho (holmium), Er (erbium), Tm (thulium) and Yb (ytterbium)), or an oxide of Co (cobalt), Ni, Li (lithium), B (boron), Na (sodium), K (potassium) and Si, or glass. In the embodiment, at least one of donor elements is added to the resulting ceramic powders.

In the embodiment, it is preferable that ceramic particles structuring the dielectric layer 11 are mixed with compound including additives and are calcined in a temperature range from 820 degrees C. to 1150 degrees C. Next, the resulting ceramic particles are wet-blended with additives, are dried and crushed. Thus, ceramic powder is obtained. For example, it is preferable that an average grain diameter of the resulting ceramic particles is 50 nm to 300 nm from a viewpoint of thickness reduction of the dielectric layer 11. The grain diameter may be adjusted by crushing the resulting ceramic powder as needed. Alternatively, the grain diameter of the resulting ceramic power may be adjusted by combining the crushing and classifying.

Next, a reverse pattern material for forming the end margin region 15 and the side margin region 16 is prepared. An additive compound may be added to ceramic powders obtained by the same process as the dielectric material, in accordance with purposes. The additive compound may be an oxide of Mn, V, Cr or a rare earth element (Y, Sm, Eu, Gd, Tb, Dy, Ho, Er, Tm and Yb), or an oxide of Co, Ni, Li, B, Na, K and Si, or glass. In the embodiment, the donor element is not added to the resulting ceramic powders. Alternatively, an amount of the donor element added to the resulting ceramic powders is less than an amount of the donor element added to the dielectric material.

In the embodiment, it is preferable that ceramic particles structuring the end margin region 15 and the side margin region 16 are mixed with compound including additives and are calcined in a temperature range from 820 degrees C. to 1150 degrees C. Next, the resulting ceramic particles are wet-blended with additives, are dried and crushed. Thus, ceramic powder is obtained. For example, it is preferable that an average grain diameter of the resulting ceramic particles is 50 nm to 300 nm, as well as the dielectric material. The grain diameter may be adjusted by crushing the resulting ceramic powder as needed. Alternatively, the grain diameter of the resulting ceramic power may be adjusted by combining the crushing and classifying.

Next, a cover material for forming the cover layer 13 is prepared. An additive compound may be added to ceramic powders obtained by the same process as the dielectric material, in accordance with purposes. The additive compound may be an oxide of Mn, V, Cr or a rare earth element (Y, Sm, Eu, Gd, Tb, Dy, Ho, Er, Tm and Yb), or an oxide of Co, Ni, Li, B, Na, K and Si, or glass. In the embodiment, the donor element is not added to the resulting ceramic powders. Alternatively, an amount of the donor element added to the resulting ceramic powders is less than an amount of the donor element added to the dielectric material.

In the embodiment, it is preferable that ceramic particles structuring the cover layer 13 are mixed with compound including additives and are calcined in a temperature range from 820 degrees C. to 1150 degrees C. Next, the resulting ceramic particles are wet-blended with additives, are dried and crushed. Thus, ceramic powder is obtained. For example, it is preferable that an average grain diameter of the resulting ceramic particles is 50 nm to 300 nm as well as the dielectric material. The grain diameter may be adjusted by crushing the resulting ceramic powder as needed. Alternatively, the grain diameter of the resulting ceramic power may be adjusted by combining the crushing and classifying.

(Stacking process) Next, a binder such as polyvinyl butyral (PVB) resin, an organic solvent such as ethanol or toluene, and a plasticizer such as dioctyl phthalate (DOP) are added to the resulting ceramic powder and wet-blended. With use of the resulting slurry, a strip-shaped dielectric green sheet with a thickness of 0.8 µm or less is coated on a base material by, for example, a die coater method or a doctor blade method, and then dried.

Then, a pattern (first pattern) of the internal electrode layer 12 is provided on the surface of the dielectric green sheet by printing metal conductive pastes for forming an internal electrode with use of screen printing or gravure printing. The conductive pastes include an organic binder. A plurality of patterns are alternatively exposed to the pair of external electrodes. As co-materials, ceramic particles are added to the conductive pastes. A main component of the ceramic particles is not limited. However, it is preferable that the main component of the ceramic particles is the same as that of the dielectric layer 11. For example, $BaTiO_3$ of which an average particle sire is 50 nm or less is evenly dispersed.

Next, a binder and an organic solvent are added to the reverse pattern material. The binder is such as ethyl cellulose. The organic solvent is such as terpineol. And the reverse pattern material is kneaded with the binder and the organic solvent by a roll mill. Thus, a reverse pattern pastes are obtained. The reverse pattern pastes are printed on a circumference area of the dielectric green sheet. The circumference area is a part of the dielectric green sheet where the internal electrode layer pattern is not printed. The internal electrode pattern acts as a reverse pattern (second pattern). Therefore, a level difference caused by the internal electrode pattern is buried.

Next, a binder such as polyvinyl butyral (PVB) resin, an organic solvent such as ethanol or toluene, and a plasticizer such as dioctyl phthalate (DOP) are added to the resulting cover material and wet-blended. With use of the resulting slurry, a strip-shaped dielectric cover sheet with a thickness of 10 µm or less is coated on a base material by, for example, a die coater method or a doctor blade method, and then dried.

Then, the dielectric green sheet on which the internal electrode layer pattern and the reverse pattern are printed is stamped into a predetermined size, and a predetermined number (for example, 100 to 500) of stamped dielectric green sheets are stacked while the base material is peeled so that the internal electrode layers 12 and the dielectric layers 11 are alternated with each other and the end edges of the internal electrode layers 12 are alternately exposed to both end faces in the length direction of the dielectric layer so as to be alternately led out to a pair of external electrodes of different polarizations. Cover sheets, which are to be the cover layers 13, are stacked on the stacked green sheets and under the stacked sheets. The resulting compact is cut into a predetermined size (for example, 1.0 mm×0.5 mm). After that, conductive pastes to be the external electrodes 20a and 20b are coated on the both edge faces of the cut multilayer structure and are dried. Thus, a compact of the multilayer ceramic capacitor 100 is obtained. It is preferable that the number of the dielectric cover sheets is determined so that the thickness of the sintered cover layer 13 is 20 µm or more, from a viewpoint of the reliability (humidity resistance).

(Baking process) The binder is removed from the compact in $N_2$ atmosphere of a temperature range of 250 degrees C. to 500 degrees C. After that, the resulting compact is baked for ten minutes to 2 hours in a reductive atmosphere having an oxygen partial pressure of $10^{-5}$ to $10^{-8}$ atm in a temperature range of 1100 degrees C. to 1300 degrees C. Thus, each compound of the dielectric green sheet is sintered and grown into grains. In this manner, it is possible to manufacture the multilayer ceramic capacitor 100.

(Re-oxidizing process) After that, a re-oxidizing process may be performed in $N^2$ gas atmosphere in a temperature range of 600 degrees C. to 1000 degrees C.

(Plating process) After that, with a plating process, a metal such as Cu, Ni, and Sn may be coated on the external electrodes 20a and 20b.

In the manufacturing method in accordance with the embodiment, the concentration of the donor element with respect to the main component ceramic in the cover material and the reverse pattern material is lower than the concentration of the donor element with respect to the main component ceramic in the dielectric material. In this case, in the baking process, the abnormal grain growth at the surface of the multilayer chip 10 and the delay of sintering is suppressed, and the structural defect is suppressed. Therefore, the reliability of the multilayer ceramic capacitor 100 is improved.

When the amount of the donor element in the reverse pattern material is excessively large, it may not be necessarily possible to sufficiently suppress the abnormal grain growth at the surface of the multilayer chip 10 and the delay of sintering. And so, it is preferable that the concentration of the donor element in the reverse pattern material has an upper limit. In the embodiment, when Mo is used as the donor element as an example, it is preferable that the concentration of Mo with respect to the main component ceramic in the reverse pattern material is less than 0.2 atm %. In this case, it is more preferable that the concentration is 0.1 atm % or less. In this case, it is still more preferable that the concentration is zero.

When the amount of the donor element in the cover material is excessively large, it may not be necessarily possible to sufficiently suppress the abnormal grain growth at the surface of the cover layer 13 and the delay of sintering. And so, it is preferable that the concentration of the donor element in the cover material has an upper limit. In the embodiment, when Mo is used as the donor element as an example, it is preferable that the concentration of Mo with respect to the main component ceramic in the cover material is less than 0.2 atm %. In this case, it is more preferable that the concentration is 0.1 atm % or less. In this case, it is still more preferable that the concentration is zero.

EXAMPLES

The multilayer ceramic capacitors in accordance with the embodiment were made and the property was measured.

(Examples 1 and 2) (Making of dielectric material) $Ho_2O_3$, $MnCO_3$, $V_2O_5$, $SiO_2$ and $MoO_3$ were weighed so that a concentration of Ho was 0.4 atm %, a concentration of Mn was 0.2 atm %, a concentration of V was 0.1 atm %, a concentration of Si was 0.6 atm % and a concentration of Mo was 0.2 atm % on a presumption that an amount of Ti of barium titanate powder (an average particle diameter was 0.15 μm) was 100 atm %. And the materials were sufficiently wet-blended by a ball mill and were crushed. Thereby, a dielectric material was obtained.

(Making of reverse pattern material) In the example 1, $Ho_2O_3$, $MnCO_3$, $V_2O_5$, $SiO_2$ and $B_2O_3$ were weighed so that a concentration of Ho was 0.4 atm %, a concentration of Mn was 2 atm %, a concentration of V was 0.1 atm %, a concentration of Si was 2 atm % and a concentration of B was 0.3 atm % on a presumption that an amount of Ti of barium titanate powder (an average particle diameter was 0.15 μm) was 100 atm %. In the example 2, $MoO_3$ was weighed so that a concentration of Mo was 0.1 atm %. And the materials were sufficiently wet-blended by a ball mill and were crushed. Thereby, a reverse pattern material was obtained.

(Making of reverse pattern paste) As the organic binder, ethyl cellulose was added to the reverse pattern material. As a solvent, terpineol was added to the reverse pattern material. And the reverse pattern material, the organic binder and the solvent were kneaded by a roll mill. Thus, the reverse pattern paste was obtained.

(Making of a multilayer ceramic capacitor) Butyral acting as an organic binder, and toluene and ethyl alcohol acting as a solvent were added to the dielectric material. A dielectric green sheet was formed by a doctor blade method so that the thickness of the dielectric layer 11 after sintering was 0.8 μm. A conductive paste for forming an internal electrode was screen-printed on the resulting green sheet. The reverse pattern paste was screen-printed on a part of the green sheet where the conductive paste was not printed. Thus, the level difference was suppressed. 250 numbers of the sheets on which the conductive paste for forming an internal electrode and the reverse pattern material were printed. Cover sheets having a thickness of 30 μm were stacked on a lower face and an upper face of the stacked sheets. After that, a multilayer structure was obtained by a thermo compression bonding. And the resulting multilayer structure was cut into a predetermined shape. Ni external electrodes were formed on the resulting multilayer structure by a dip method. After removing the binder in a $N_2$ atmosphere, the resulting multilayer structure was baked at 1250 degrees C. in a reductive atmosphere ($O_2$ partial pressure: $10^{-5}$ to $10^{-8}$ atm). And sintered multilayer structure was formed. A length was 0.6 mm. A width was 0.3 mm. A height was 0.3 mm. The sintered multilayer structure was re-oxidized in a $N_2$ atmosphere at 800 degrees C. After that, metals of Cu, Ni and Sn were coated on a surface of external electrode terminals by plating. And, a multilayer ceramic capacitor was formed. After baking, the thickness of the internal electrode layers 12 was 1.0 μm.

(Comparative example 1) In the comparative example 1, in the process of making the reverse pattern material, $Ho_2O_3$, $MnCO_3$, $V_2O_5$, $SiO_2$, $B_2O_3$ and $MoO_3$ were weighed so that a concentration of Ho was 0.4 atm %, a concentration of Mn was 2 atm %, a concentration of V was 0.1 atm %, a concentration of Si was 2 atm %, a concentration of B was 0.3 atm % and a concentration of Mo was 0.2 atm % on a presumption that an amount of Ti of barium titanate powder (an average particle diameter was 0.15 μm) was 100 atm %. Other conditions were the same as those of the example 1.

(Comparative example 2) In the comparative example 2, in the process of making the dielectric material, $Ho_2O_3$, $MnCO_3$, $V_2O_5$ and $SiO_2$ were weighed so that a concentration of Ho was 0.4 atm %, a concentration of Mn was 0.2 atm %, a concentration of V was 0.1 atm % and a concentration of Si was 0.6 atm % on a presumption that an amount of Ti of barium titanate powder (an average particle diameter was 0.15 μm) was 100 atm %. Mo source was not added. Other conditions were the same as those of the example 1.

(Analysis) A HALT (Highly Accelerated Limit Test) defect rate and a capacity acquisition rate were measured with respect to the examples 1 and 2 and the comparative examples 1 and 2. HALT tests of 125 degrees C.—12 Vdc—120 min—100 numbers were performed. Samples whose short defect rate was less than 5% were determined as acceptance (circle). Samples whose short defect rate was less than 10% and 5% or more were determined as (triangle). Samples whose short defect rate was 10% or more were determined as not acceptance (cross). A capacity was measured by an LCR meter in the measuring of the capacity acquisition rate. Measured values were compared with a design value that was calculated from a dielectric constant of a dielectric material (a dielectric constant was calculated by making a disc-shaped sintered material having a size of ϕ=10 mm×T=1 mm from only a dielectric material in advance and measuring a capacitance), a crossing area of internal electrodes, a thickness of a dielectric ceramic layer, and the number of stacked layers. When a capacity acquisition rate (measured value/design value×100) was 95% to 105%, it was determined as acceptance (circle).

Table 1 illustrates measured results.

TABLE 1

| | Mo (atm %) | | | EFFECT | | | |
|---|---|---|---|---|---|---|---|
| | DIELECTRIC MATERIAL | REVERSE PATTERN MATERIAL | MARGIN | HALT DEFECT RATE | | CAPACTIY ACQUISITION RATE | |
| EXAMPLE 1 | 0.20 | 0.00 | 0.10 | 0% | ○ | 101% | ○ |
| EXAMPLE 2 | 0.20 | 0.10 | 0.15 | 6% | Δ | 99% | ○ |
| COMPARATIVE EXAMPLE 1 | 0.20 | 0.20 | 0.20 | 31% | X | 96% | ○ |
| COMPARATIVE EXAMPLE 2 | 0.00 | 0.00 | 0.00 | 50% | X | 105% | ○ |

In Table 1, in a column "margin", an average value of the dielectric material and the reverse pattern material is shown because the dielectric material and the reverse pattern material are alternately stacked in the margin region. In the comparative example 1, the HALT defect rate was large value of 31%. It is thought that this is because a large amount of Mo was added to the reverse pattern material and the structural defect occurred because of the abnormal grain growth at the surface of the multilayer chip 10 or the delay of sintering. Next, the HALT defect rate was also large value of 50% in the comparative example 2. It is thought that this is because Mo was not added to the dielectric material and the life time of the dielectric layers 11 was not elongated. On the other hand, in the examples 1 and 2, the HALT defect rate was less than 10%. It is thought that this is because the concentration of Mo with respect to the main component ceramic in the reverse pattern material was lower than the concentration of Mo with respect to the main component ceramic in the dielectric material, the life time of the dielectric layers 11 was elongated, the abnormal grain growth at the surface of the multilayer chip 10 or the delay of sintering was suppressed, and the structural defect was suppressed. The concentration of Mo with respect to the main component ceramic in the whole of the margin region after the baking was lower than the concentration of Mo with respect to the main component ceramic in the dielectric layers 11 in the capacity region 14.

Next, the HALT defect rate of the example 1 was lower than that of the example 2. It is thought that this is because Mo was not added to the reverse patter material and the concentration of Mo with respect to the main component ceramic in the margin region got lower.

In the comparative examples 1 and 2, variation occurred in the capacity acquisition rate, compared to the examples 1 and 2. In the comparative example 1, the capacity acquisition rate was low. It is thought that this is because the grain growth near the side margin region was promoted because of the excessive amount of Mo, Ni in the edge portion of the internal electrode layers was spheroidized (the continuity got lower), and the capacity acquisition got lower. In the comparative example 2, the capacity acquisition rate got higher. It is though that this is because Mo for promoting the grain growth was not added in the comparative example 2, the total amount of additives was small, and the relative dielectric constant slightly got higher.

(Examples 3 and 4) (Making of dielectric material) $Ho_2O_3$, $MnCO_3$, $V_2O_5$, $SiO_2$ and $MoO_3$ were weighed so that a concentration of Ho was 0.4 atm %, a concentration of Mn was 0.2 atm %, a concentration of V was 0.1 atm %, a concentration of Si was 0.6 atm % and a concentration of Mo was 0.2 atm % on a presumption that an amount of Ti of barium titanate powder (an average particle diameter was 0.15 μm) was 100 atm %. And the materials were sufficiently wet-blended by a ball mill and were crushed. Thereby, a dielectric material was obtained.

(Making of cover material) In the example 3, $Ho_2O_3$, $MnCO_3$, $V_2O_5$ and $SiO_2$ were weighed so that a concentration of Ho was 0.4 atm %, a concentration of Mn was 0.2 atm %, a concentration of V was 0.1 atm % and a concentration of Si was 0.6 atm % on a presumption that an amount of Ti of barium titanate powder (an average particle diameter was 0.2 μm) was 100 atm %. In the example 4, $MoO_3$ was weighed so that a concentration of Mo was 0.1 atm %. In the example 5, $MoO_3$ was weighed so that a concentration of Mo was 0.17 atm %. And the materials were sufficiently wet-blended by a ball mill and were crushed. Thereby, the reverse pattern material was obtained.

(Making of a multilayer ceramic capacitor) Butyral acting as an organic binder, and toluene and ethyl alcohol acting as a solvent were added to the dielectric material. A green sheet was formed by a doctor blade method so that the thickness of the dielectric layer 11 after sintering was 0.8 μm. A conductive paste for forming an internal electrode was screen-printed on the resulting green sheet. 250 numbers of the sheets on which the conductive paste for forming an internal electrode was printed were stacked. Then, butyral acting as an organic binder, and toluene and ethyl alcohol acting as a solvent were added to the cover material. And a cover sheet was formed by a doctor blade method sot that a thickness of the cover sheet after sintering was 10 μm. After that, three cover sheets were stacked on both a lower face and an upper face of the stacked dielectric green sheets.

After that, a multilayer structure was obtained by a thermo compression bonding. And the resulting multilayer structure was cut into a predetermined shape. Ni external electrodes were formed on the resulting multilayer structure by a dip method. After removing the binder in a $N_2$ atmosphere, the resulting multilayer structure was baked at 1250 degrees C. in a reductive atmosphere ($O_2$ partial pressure: $10^{-5}$ to $10^{-8}$ atm). And sintered multilayer structure was formed. A length was 0.6 mm. A width was 0.3 mm. A height was 0.3 mm. The sintered multilayer structure was re-oxidized in a $N_2$ atmosphere at 800 degrees C. After that, metals of Cu, Ni and Sn were coated on a surface of external electrode terminals by plating. And, a multilayer ceramic capacitor was formed. After baking, the thickness of the internal electrode layers 12 was 1.0 μm.

(Comparative example 3) In the comparative example 3, in the process of making the cover material, $Ho_2O_3$, $MnCO_3$, $V_2O_5$, $SiO_2$ and $MoO_3$ were weighed so that a concentration of Ho was 0.4 atm %, a concentration of Mn was 0.2 atm %, a concentration of V was 0.1 atm %, a concentration of Si was 0.6 atm % and a concentration of Mo was 0.2 atm % on a presumption that an amount of Ti of barium titanate powder (an average particle diameter was 0.15 μm) was 100 atm %. Other conditions were the same as those of the example 3.

(Comparative example 4) In the comparative example 4, in the process of making the dielectric material, $Ho_2O_3$, $MnCO_3$, $V_2O_5$ and $SiO_2$ were weighed so that a concentration of Ho was 0.4 atm %, a concentration of Mn was 0.2 atm %, a concentration of V was 0.1 atm % and a concentration of Si was 0.6 atm % on a presumption that an amount of Ti of barium titanate powder (an average particle diameter was 0.15 μm) was 100 atm %. Mo source was not added. Other conditions were the same as those of the example 3.

(Analysis) A HALT (Highly Accelerated Limit Test) defect rate and a capacity acquisition rate were measured with respect to the examples 3 to 5 and the comparative examples 3 and 4. HALT tests of 125 degrees C.—12 Vdc—120 min—100 numbers were performed. Samples whose short defect rate was less than 5% were determined as acceptance (circle). Samples whose short defect rate was less than 10% and 5% or more were determined as (triangle). Samples whose short defect rate was 10% or more were determined as not acceptance (cross). A capacity was measured by an LCR meter in the measuring of the capacity acquisition rate. Measured values were compared with a design value that was calculated from a dielectric constant of a dielectric material (a dielectric constant was calculated by making a disc-shaped sintered material having a size of φ=10 mm×T=1 mm from only a dielectric material in advance and measuring a capacity), a crossing area of internal electrodes, a thickness of a dielectric ceramic layer, and the number of stacked layers. When a capacity acquisition rate (measured value/design value×100) was 95% to 105%, it was determined as acceptance (circle).

Table 2 illustrates measured results.

TABLE 2

| | Mo (atm %) | | EFFECT | | | |
|---|---|---|---|---|---|---|
| | DIELECTRIC MATERIAL | COVER MATERIAL | HALT DEFECT RATE | | CAPACITY ACQUISITION RATE | |
| EXAMPLE 3 | 0.20 | 0.00 | 0% | ○ | 101% | ○ |
| EXAMPLE 4 | 0.20 | 0.10 | 4% | ○ | 99% | ○ |
| EXAMPLE 5 | 0.20 | 0.17 | 9% | Δ | 97% | ○ |
| COMPARATIVE EXAMPLE 3 | 0.20 | 0.20 | 31% | X | 96% | ○ |
| COMPARATIVE EXAMPLE 4 | 0.00 | 0.00 | 50% | X | 105% | ○ |

In the comparative example 3, the HALT defect rate was large value of 31%. It is thought that this is because a large amount of Mo was added to the cover material and the structural defect occurred because of the abnormal grain growth at the surface of the cover layer 13 or the delay of sintering. Next, the HALT defect rate was also large value of 50% in the comparative example 4. It is thought that this is because Mo was not added to the dielectric material and the life time of the dielectric layers 11 was not elongated. On the other hand, in the examples 3 to 5, the HALT defect rate was less than 10%. It is thought that this is because the concentration of Mo with respect to the main component ceramic in the cover material was lower than the concentration of Mo with respect to the main component ceramic in the dielectric material, the life time of the dielectric layers 11 was elongated, the abnormal grain growth at the surface of the cover layer 13 or the delay of sintering was suppressed, and the structural defect was suppressed. The concentration of Mo with respect to the main component ceramic in the cover layer 13 after the baking was lower than the concentration of Mo with respect to the main component ceramic in the dielectric layers 11.

Next, the HALT defect rate of the examples 4 and 5 was lower than that of the example 3. It is thought that this is because Mo was not added to the cover material in the example 3 and the concentration of Mo with respect to the main component ceramic in the cover sheet got lower.

In the comparative examples 3 and 4, variation occurred in the capacity acquisition rate, compared to the examples 3 and 4. In the comparative example 3, the capacity acquisition rate was low. It is thought that this is because the grain growth near the side margin region was promoted because of the excessive amount of Mo, Ni in the edge portion of the internal electrode layers was spheroidized (the continuity got lower), and the capacity acquisition got lower. In the comparative example 4, the capacity acquisition rate got higher. It is though that this is because Mo for promoting the grain growth was not added in the comparative example 4, the total amount of additives was small, and the relative dielectric constant slightly got higher.

Although the embodiments of the present invention have been described in detail, it is to be understood that the various change, substitutions, and alterations could be made hereto without departing from the spirit and scope of the invention.

What is claimed is:

1. A multilayer ceramic capacitor comprising:
    a multilayer structure in which each of a plurality of dielectric layers and each of a plurality of internal electrode layers are alternately stacked, a main component of the dielectric layers being ceramic, the multilayer structure having a rectangular parallelepiped shape, the plurality of internal electrode layers being alternately exposed to a first edge face and a second edge face of the multilayer structure, the first edge face facing with the second edge face;

wherein:

a main component ceramic of an end margin region and a main component ceramic of a side margin region include Mo;

a concentration of Mo with respect to the main component ceramic of the end margin region and a concentration of Mo with respect to the main component ceramic of the side margin region are lower than a concentration of Mo with respect to the main component ceramic of the dielectric layers in the multilayer structure;

the main component ceramic of the end margin region, the main component ceramic of the side margin region and the main component ceramic of the dielectric layers of the multilayer structure are barium titanate;

the end margin region is a region in which internal electrode layers coupled to the first edge face of the multilayer structure face with each other without sandwiching internal electrode layers coupled to the second edge face of the multilayer structure and another region in which internal electrode layers coupled to the second edge face of the multilayer structure face with each other without sandwiching internal electrode layers coupled to the first edge face of the multilayer structure;

the side margin region covers edge portions to which the plurality of internal electrode layers extend toward two side faces other than the first edge face and the second edge face; and the concentration of Mo with respect to the main component ceramic of the end margin region and the concentration of Mo with respect to the main component ceramic of the side margin region are less than 0.2 atm %.

2. A manufacturing method of a multilayer ceramic capacitor, comprising:

providing a first pattern of metal conductive pastes, on a green sheet including main component ceramic particles;

forming a stack unit by providing a second pattern including main component ceramic particles, on a region of the green sheet around the metal conductive pastes;

forming a ceramic multilayer structure by stacking a plurality of the stack units so that each position of the first pattern is alternately shifted; and baking the ceramic multilayer structure, wherein the main component ceramic particles of the green sheet and the main component ceramic particles of the second pattern include Mo, wherein the main component ceramic particles of the green sheet and the main component ceramic particles of the second pattern are barium titanate, wherein a concentration of Mo with respect to the main component ceramic particles of the second pattern is lower than a concentration of Mo with respect to the main component ceramic particles of the green sheet, and wherein the concentration of Mo with respect to the main component ceramic of the second pattern is less than 0.2 atm %.

* * * * *